(12) United States Patent
Kulavik et al.

(10) Patent No.: US 11,791,790 B2
(45) Date of Patent: *Oct. 17, 2023

(54) METHOD AND SYSTEM FOR A HEADSET WITH INTEGRATED ENVIRONMENTAL SENSORS

(71) Applicant: Voyetra Turtle Beach, Inc., White Plains, NY (US)

(72) Inventors: Richard Kulavik, San Jose, CA (US); Michael Jessup, San Jose, CA (US)

(73) Assignee: Voyetra Turtle Beach, Inc., White Plains, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/466,534

(22) Filed: Sep. 3, 2021

(65) Prior Publication Data

US 2021/0399707 A1   Dec. 23, 2021

Related U.S. Application Data

(63) Continuation of application No. 14/457,688, filed on Aug. 12, 2014, now Pat. No. 11,128,275.
(Continued)

(51) Int. Cl.
*H03G 3/32* (2006.01)
*H04R 1/10* (2006.01)
(Continued)

(52) U.S. Cl.
CPC ............ *H03G 3/32* (2013.01); *H04R 1/1041* (2013.01); *H04R 1/1008* (2013.01); *H04R 3/005* (2013.01);
(Continued)

(58) Field of Classification Search
CPC ...... H03G 3/32; H04R 1/1041; H04R 1/1008; H04R 3/005; H04R 2201/107;
(Continued)

(56) References Cited

U.S. PATENT DOCUMENTS 5,654,690 A * 8/1997 Ishikawa ............... G08B 25/04
340/288
5,764,778 A  6/1998 Zurek
(Continued)

FOREIGN PATENT DOCUMENTS

GB         2344240 A * 5/2000  ............ G01S 3/781

*Primary Examiner* — Daniel R Sellers
(74) *Attorney, Agent, or Firm* — McAndrews, Held & Malloy, Ltd.

(57) ABSTRACT

An electronic device receives audio from an audio source and outputs the audio via speakers of the device. While outputting the audio via the speakers, the device senses its surrounding environment, and adjusts its operation, based on the sensed environment, to alert a listener wearing the device. The adjustment may comprise generation of one or more audio, visual, and/or vibration notifications to the listener using the device. A volume of the audio output via the speakers may be adjusted based on the sensed surrounding environment. The device may detect whether a first condition is present in the surrounding environment, decrease the volume when the first condition is detected in the surrounding environment, and increase the volume when the first condition is not detected in the surrounding environment.

18 Claims, 11 Drawing Sheets

Related U.S. Application Data

(60) Provisional application No. 61/889,108, filed on Oct. 10, 2013.

(51) Int. Cl.
*H04R 3/00* (2006.01)
*H04S 7/00* (2006.01)

(52) U.S. Cl.
CPC .. *H04R 2201/107* (2013.01); *H04R 2201/401* (2013.01); *H04R 2430/01* (2013.01); *H04R 2460/07* (2013.01); *H04S 7/304* (2013.01)

(58) Field of Classification Search
CPC .......... H04R 2201/401; H04R 2430/01; H04R 2460/07; H04S 7/304
See application file for complete search history.

(56) References Cited

U.S. PATENT DOCUMENTS

| | | | |
|---|---|---|---|
| 6,319,120 B1* | 11/2001 | Motosko | A63F 9/24 463/7 |
| 7,359,504 B1 | 4/2008 | Reuss et al. | |
| 2003/0216181 A1 | 11/2003 | Danieli et al. | |
| 2008/0079571 A1 | 4/2008 | Samadani | |
| 2009/0082071 A1 | 3/2009 | Hicks, III | |
| 2010/0302033 A1 | 12/2010 | Devenyi et al. | |
| 2011/0044460 A1 | 2/2011 | Rung | |
| 2012/0280824 A1* | 11/2012 | Zelepugas | G01S 17/86 73/632 |
| 2013/0142347 A1* | 6/2013 | Lord | H04R 29/005 381/58 |
| 2013/0170647 A1* | 7/2013 | Reilly | H04R 3/04 381/17 |
| 2013/0293723 A1* | 11/2013 | Benson | H04R 5/033 381/74 |
| 2014/0093091 A1 | 4/2014 | Dusan et al. | |
| 2014/0270200 A1 | 9/2014 | Usher et al. | |
| 2014/0314242 A1* | 10/2014 | Gollbach | H04R 1/1041 381/71.6 |

* cited by examiner

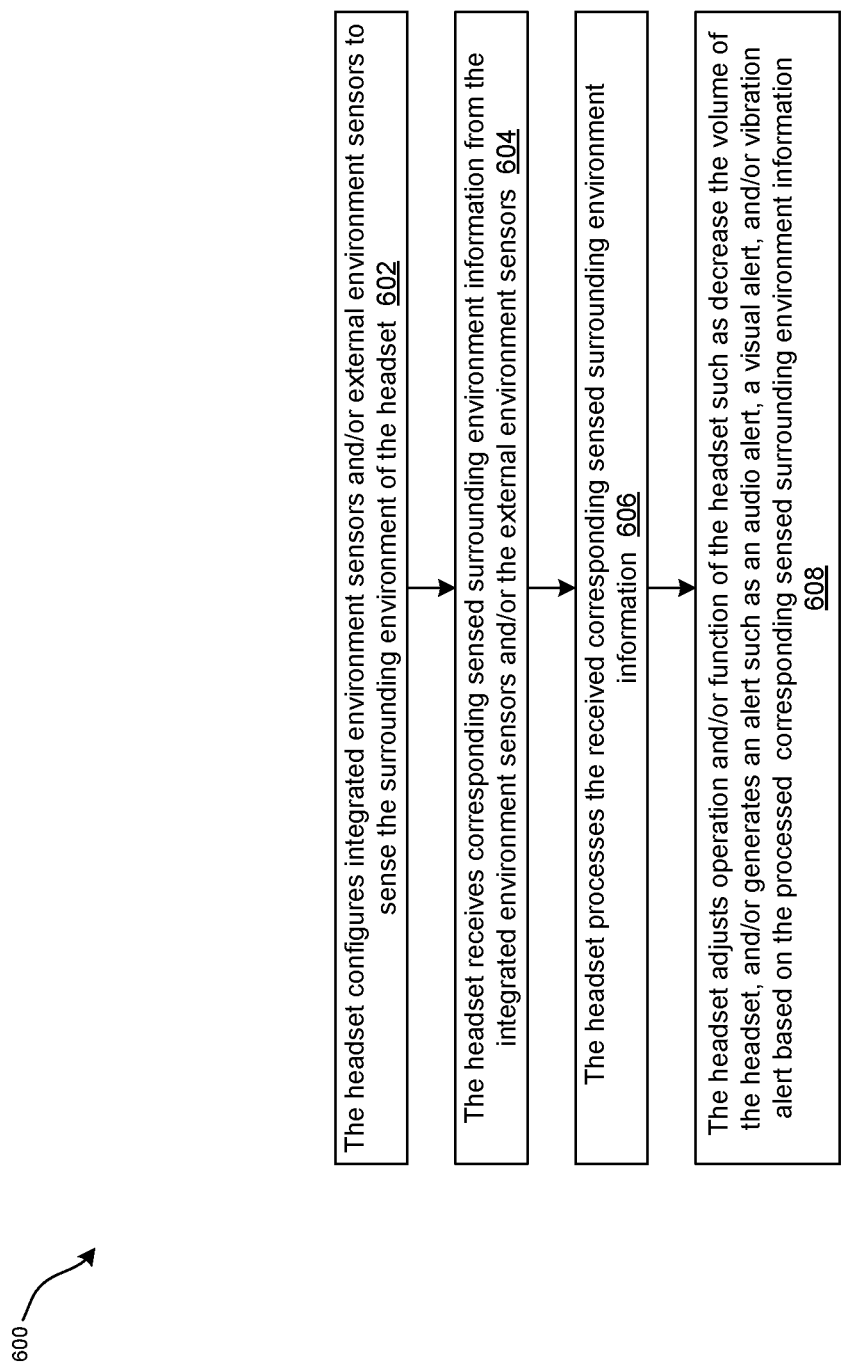

METHOD AND SYSTEM FOR A HEADSET WITH INTEGRATED ENVIRONMENTAL SENSORS

CLAIM OF PRIORITY

This application is a continuation of U.S. application Ser. No. 14/457,688 filed on Aug. 14, 2014, which claims the benefit of priority to U.S. provisional patent application 61/889,108 filed on Oct. 10, 2013. Each of the aforementioned documents is hereby incorporated herein by reference in its entirety.

INCORPORATION BY REFERENCE

United States patent application publication US2012/0014553 titled "Gaming Headset with Programmable Audio" is hereby incorporated herein by reference in its entirety.

TECHNICAL FIELD

Aspects of the present application relate to electronic gaming. More specifically, to methods and systems for a headset with integrated environment sensors.

BACKGROUND

Limitations and disadvantages of conventional approaches to audio processing for gaming will become apparent to one of skill in the art, through comparison of such approaches with some aspects of the present method and system set forth in the remainder of this disclosure with reference to the drawings.

BRIEF SUMMARY

Methods and systems are provided for a headset with integrated environment sensors, substantially as illustrated by and/or described in connection with at least one of the figures, as set forth more completely in the claims.

BRIEF DESCRIPTION OF THE DRAWINGS

FIG. 6 is a flow diagram illustrating exemplary steps for providing headset with integrated environment sensor, in accordance with various exemplary embodiments of the disclosure.

DETAILED DESCRIPTION

Certain embodiments of the disclosure may be found in a method and system for a headset with integrated environment sensors. An electronic device may receive audio from an audio source and output the audio via speakers of the game headset. While outputting the audio via the speakers, the device may sense its surrounding environment, and adjust its operation, based on the sensed environment, to alert a listener wearing the game headset. The adjustment may comprise generation of one or more audio, visual, and/or vibration notifications to the listener using the device. The device may output a visual alert for presentation on a display that presents video corresponding to the receive audio and/or on a second screen communication device. A volume of the audio output via the speakers may be adjusted based on the sensed surrounding environment. The device may detect whether a first condition is present in the surrounding environment, decreasing the volume when the first condition is detected in the surrounding environment, and increasing the volume when the first condition is not detected in the surrounding environment. The device may detect whether a first condition is present in the surrounding environment, mute the volume when a first condition is detected in the surrounding environment, and unmute the volume when the first condition is not detected in the surrounding environment. The device may comprise one or more integrated sensors that are operable to perform the sensing of the surrounding environment. The device may receive external sensed information for the surrounding environment from one or more sensors that are external to the device. The device may generate one or more notifications to the listener using the device based on the external sensed information.

Figure 1A:
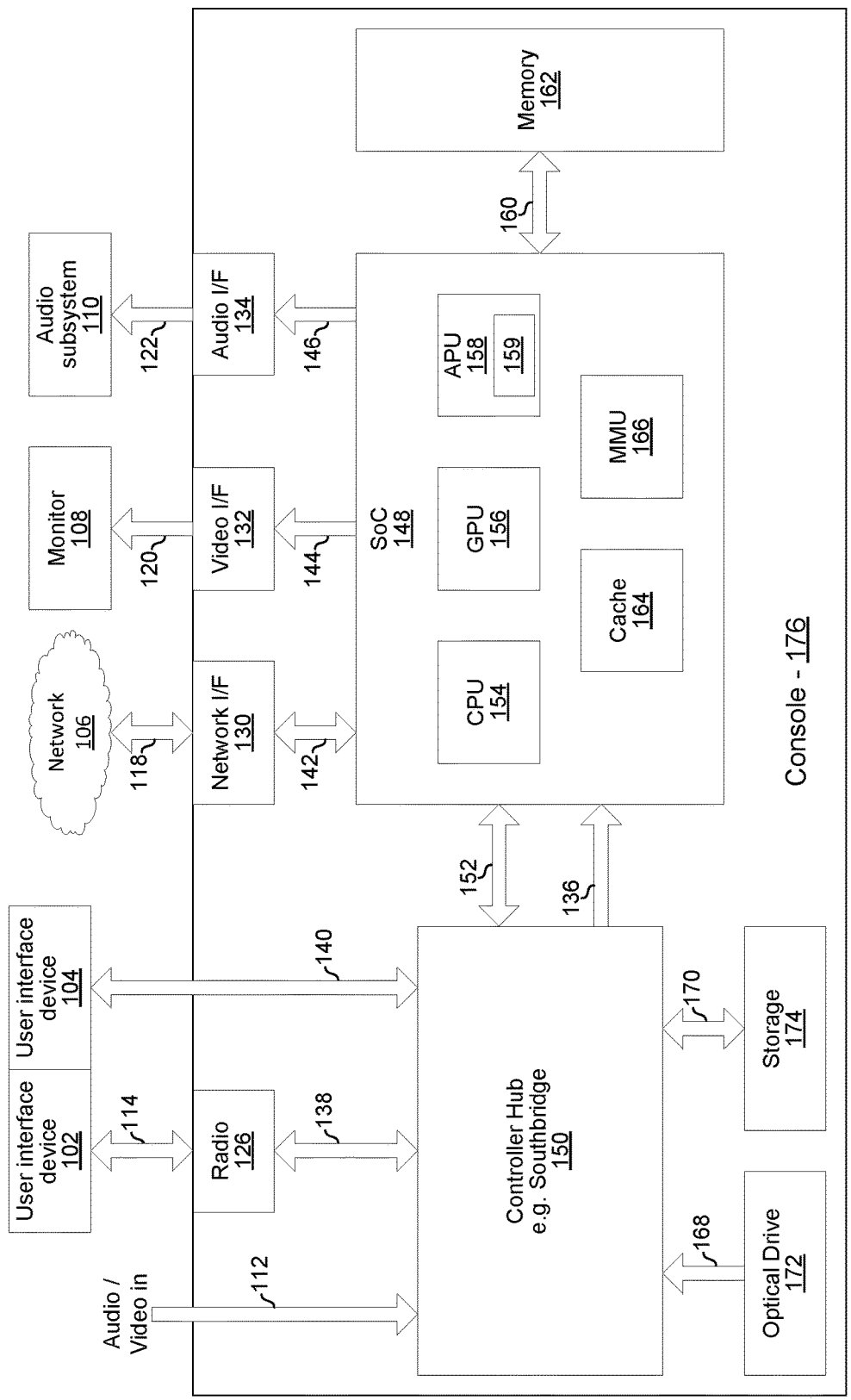
FIG. 1A is a diagram that depicts an example gaming console, which may be utilized to provide headset with integrated environment sensor, in accordance with various exemplary embodiments of the disclosure.

FIG. 1A depicts an example gaming console, which may be utilized to provide headset with integrated environment sensor, in accordance with various exemplary embodiment of the disclosure. Referring to FIG. 1, there is shown a console 176, user interface devices 102, 104, a monitor 108, an audio subsystem 110, and a network 106.

The game console 176 may comprise suitable logic, circuitry, interfaces and/or code that may be operable to present a game to, and also enable game play interaction between, one or more local players and/or one or more remote players. The game console 176 which may be, for example, a Windows computing device, a Unix computing device, a Linux computing device, an Apple OSX computing device, an Apple iOS computing device, an Android computing device, a Microsoft Xbox, a Sony Playstation, a Nintendo Wii, or the like. The example game console 176 comprises a radio 126, network interface 130, video interface 132, audio interface 134, controller hub 150, main system on chip (SoC) 148, memory 162, optical drive 172, and storage device 174. The SoC 148 comprises central processing unit (CPU) 154, graphics processing unit (GPU)

156, audio processing unit (APU) 158, cache memory 164, and memory management unit (MMU) 166. The various components of the game console 176 are communicatively coupled through various buses/links 136, 138, 142, 144, 146, 152, 160, 168, and 170.

The controller hub 150 comprises circuitry that supports one or more data bus protocols such as High-Definition Multimedia Interface (HDMI), Universal Serial Bus (USB), Serial Advanced Technology Attachment II, III or variants thereof (SATA II, SATA III), embedded multimedia card interface (e.MMC), Peripheral Component Interconnect Express (PCIe), or the like. The controller hub 150 may also be referred to as an input/output (I/O) controller hub. Exemplary controller hubs may comprise Southbridge, Haswell, Fusion and Sandybridge. The controller hub 150 may be operable to receive audio and/or video from an external source via link 112 (e.g., HDMI), from the optical drive (e.g., Blu-Ray) 172 via link 168 (e.g., SATA II, SATA III), and/or from storage 174 (e.g., hard drive, FLASH memory, or the like) via link 170 (e.g., SATA II, III and/or e.MMC). Digital audio and/or video is output to the SoC 148 via link 136 (e.g., CEA-861-E compliant video and IEC 61937 compliant audio). The controller hub 150 exchanges data with the radio 126 via link 138 (e.g., USB), with external devices via link 140 (e.g., USB), with the storage 174 via the link 170, and with the SoC 148 via the link 152 (e.g., PCIe).

The radio 126 may comprise suitable logic, circuitry, interfaces and/or code that may be operable to communicate in accordance with one or more wireless standards such as the IEEE 802.11 family of standards, the Bluetooth family of standards, near field communication (NFC), and/or the like.

The network interface 130 may comprise suitable logic, circuitry, interfaces and/or code that may be operable to communicate in accordance with one or more wired standards and to convert between wired standards. For example, the network interface 130 may communicate with the SoC 148 via link 142 using a first standard (e.g., PCIe) and may communicate with the network 106 using a second standard (e.g., gigabit Ethernet).

The video interface 132 may comprise suitable logic, circuitry, interfaces and/or code that may be operable to communicate video in accordance with one or more wired or wireless video transmission standards. For example, the video interface 132 may receive CEA-861-E compliant video data via link 144 and encapsulate/format, etc., the video data in accordance with an HDMI standard for output to the monitor 108 via an HDMI link 120.

The audio interface 134 may comprise suitable logic, circuitry, interfaces and/or code that may be operable to communicate audio in accordance with one or more wired or wireless audio transmission standards. For example, the audio interface 134 may receive CEA-861-E compliant audio data via the link 146 and encapsulate/format, etc. the video data in accordance with an HDMI standard for output to the audio subsystem 110 via an HDMI link 122.

The central processing unit (CPU) 154 may comprise suitable logic, circuitry, interfaces and/or code that may be operable to execute instructions for controlling/coordinating the overall operation of the game console 176. Such instructions may be part of an operating system of the console and/or part of one or more software applications running on the console.

The graphics processing unit (GPU) 156 may comprise suitable logic, circuitry, interfaces and/or code that may be operable to perform graphics processing functions such as compression, decompression, encoding, decoding, 3D rendering, and/or the like.

The audio processing unit (APU) 158 may comprise suitable logic, circuitry, interfaces and/or code that may be operable to perform audio processing functions such as volume/gain control, compression, decompression, encoding, decoding, surround-sound processing, and/or the like to output single channel or multi-channel (e.g., 2 channels for stereo or 5, 7, or more channels for surround sound) audio signals. The APU 158 comprises memory (e.g., volatile and/or non-volatile memory) 159 which stores parameter settings to affect processing of audio by the APU 158. For example, the parameter settings may include a first audio gain/volume setting that determines, at least in part, a volume of game audio output by the console 176 and a second audio gain/volume setting that determines, at least in part, a volume of chat audio output by the console 176. The parameter settings may be modified via a graphical user interface (GUI) of the console and/or via an application programming interface (API) provided by the console 176.

The cache memory 164 may comprise suitable logic, circuitry, interfaces and/or code that may provide high-speed memory functions for use by the CPU 154, GPU 156, and/or APU 158. The cache memory 164 may typically comprise DRAM or variants thereof. The memory 162 may comprise additional memory for use by the CPU 154, GPU 156, and/or APU 158. The memory 162, typically DRAM, may operate at a slower speed than the cache memory 164 but may also be less expensive than cache memory as well as operate at a higher speed than the memory of the storage device 174. The MMU 166 controls accesses by the CPU 154, GPU 156, and/or APU 158 to the memory 162, the cache 164, and/or the storage device 174.

In FIG. 1A, the example game console 176 is communicatively coupled to the user interface device 102, the user interface device 104, the network 106, the monitor 108, and the audio subsystem 110.

Each of the user interface devices 102 and 104 may comprise, for example, a game controller, a keyboard, a motion sensor/position tracker, or the like. The user interface device 102 communicates with the game console 176 wirelessly via link 114 (e.g., Wi-Fi Direct, Bluetooth, NFC and/or the like). The user interface device 102 may be operable to communicate with the game console 176 via the wired link 140 (e.g., USB or the like).

The network 106 comprises a local area network and/or a wide area network. The game console 176 communicates with the network 106 via wired link 118 (e.g., Gigabit Ethernet).

The monitor 108 may be, for example, a LCD, OLED, or PLASMA screen. The game console 176 sends video to the monitor 108 via link 120 (e.g., HDMI).

The audio subsystem 110 may be, for example, a headset, a combination of headset and audio basestation, or a set of speakers and accompanying audio processing circuitry. The game console 176 sends audio to the audio subsystem 110 via link(s) 122 (e.g., S/PDIF for digital audio or "line out" for analog audio). Additional details of an example audio subsystem 110 are described below.

Figure 1B:
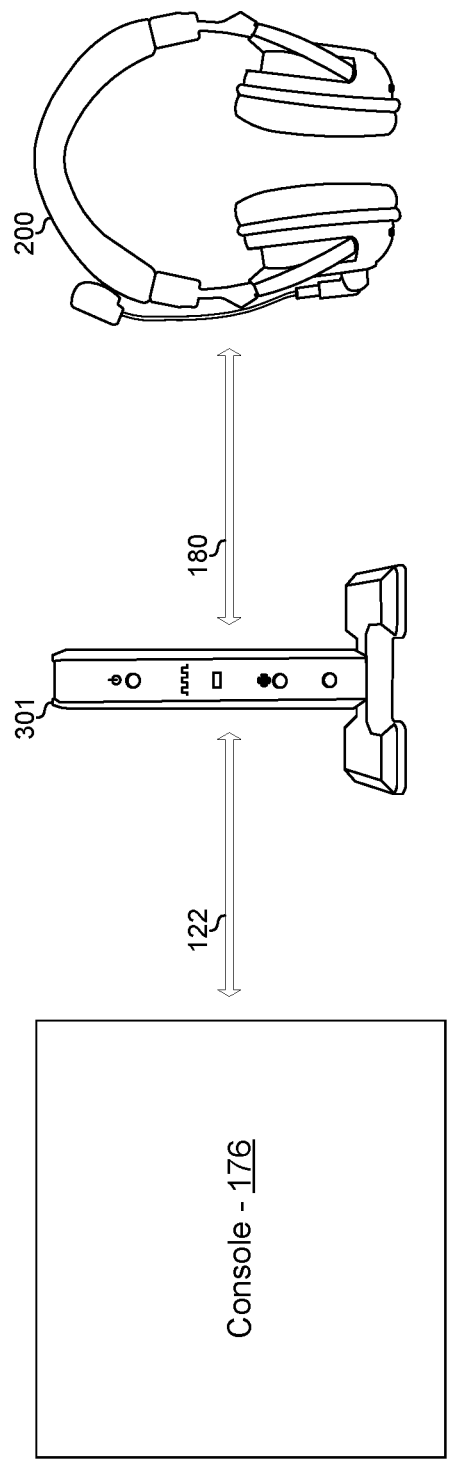
FIG. 1B is a diagram that depicts an example gaming audio subsystem comprising a headset and an audio basestation, in accordance with various exemplary embodiments of the disclosure.

FIG. 1B is a diagram that depicts an example gaming audio subsystem comprising a headset and an audio basestation, in accordance with various exemplary embodiments of the disclosure. Referring to FIG. 1B, there is shown a console 176, a headset 200 and an audio basestation 301. The headset 200 communicates with the basestation 301 via a link 180 and the basestation 301 communicates with the console 176 via a link 122. The link 122 may be as described above. In an example implementation, the link 180 may be a proprietary wireless link operating in an unlicensed frequency band. The headset 200 may be as described below with reference to FIGS. 2A-2C. The basestation 301 may be as described below with reference to FIGS. 3A-3B.

Figure 1C:
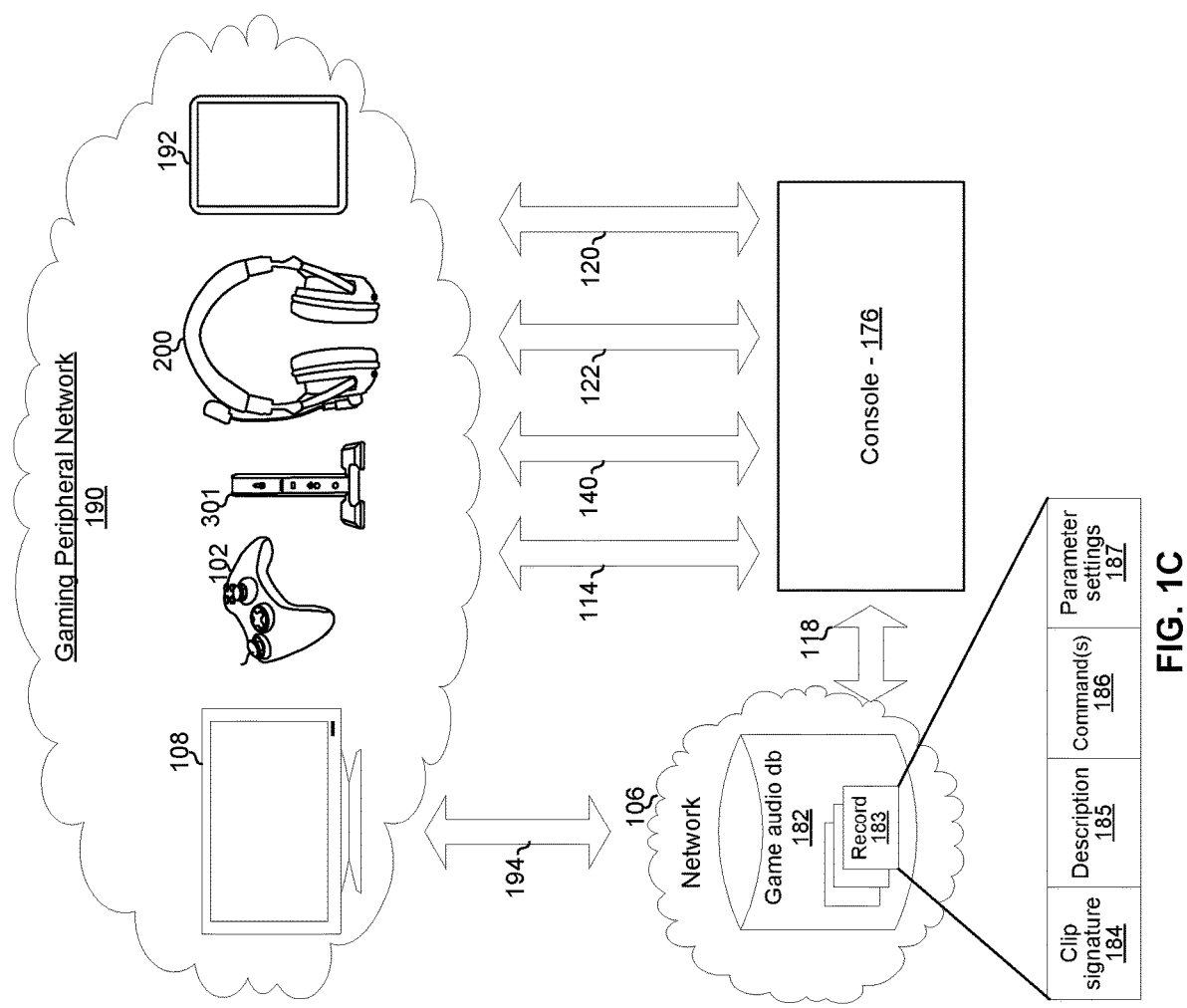
FIG. 1C is a diagram of an exemplary gaming console and an associated network of peripheral devices, in accordance with various exemplary embodiments of the disclosure.

FIG. 1C is a diagram of an exemplary gaming console and an associated network of peripheral devices, in accordance with various exemplary embodiments of the disclosure. Referring to FIG. 1C, there is shown is the console 176, which is communicatively coupled to a plurality of peripheral devices and a network 106. The example peripheral devices shown include a monitor 108, a user interface device 102, a headset 200, an audio basestation 301, and a multi-purpose device 192.

The monitor 108 and the user interface device 102 are as described above. The headset 200 is as described below with reference to FIGS. 2A-2C. The audio basestation is as described below with reference to, for example, FIGS. 3A-3B.

The multi-purpose device 192 may comprise, for example, a tablet computer, a smartphone, a laptop computer, or the like and that runs an operating system such as Android, Linux, Windows, iOS, OSX, or the like. An example multi-purpose device is described below with reference to FIG. 4. Hardware (e.g., a network adaptor) and software (i.e., the operating system and one or more applications loaded onto the device 192) may configure the device 192 for operating as part of the GPN 190. For example, an application running on the device 192 may cause display of a graphical user interface (GUI), which may enable a user to access gaming-related data, commands, functions, parameter settings, and so on. The graphical user interface may enable a user to interact with the console 176 and the other devices of the GPN 190 to enhance the user's gaming experience.

The peripheral devices 102, 108, 192, 200, 300 are in communication with one another via a plurality of wired and/or wireless links (represented visually by the placement of the devices in the cloud of GPN 190). Each of the peripheral devices in the gaming peripheral network (GPN) 190 may communicate with one or more others of the peripheral devices in the GPN 190 in a single-hop or multi-hop fashion. For example, the headset 200 may communicate with the basestation 301 in a single hop (e.g., over a proprietary RF link) and with the device 192 in a single hop (e.g., over a Bluetooth or Wi-Fi direct link), while the tablet may communicate with the basestation 301 in two hops via the headset 200. As another example, the user interface device 102 may communicate with the headset 200 in a single hop (e.g., over a Bluetooth or Wi-Fi direct link) and with the device 192 in a single hop (e.g., over a Bluetooth or Wi-Fi direct link), while the device 192 may communicate with the headset 200 in two hops via the user interface device 102. These example interconnections among the peripheral devices of the GPN 190 are merely examples, any number and/or types of links and/or hops among the devices of the GPN 190 is possible.

The GPN 190 may communicate with the console 176 via any one or more of the connections 114, 140, 122, and 120 described above. The GPN 190 may communicate with a network 106 via one or more links 194 each of which may be, for example, Wi-Fi, wired Ethernet, and/or the like.

A database 182 which stores gaming audio data is accessible via the network 106. The gaming audio data may comprise, for example, signatures of particular audio clips (e.g., individual sounds or collections or sequences of sounds) that are part of the game audio of particular games, of particular levels/scenarios of particular games, particular characters of particular games, etc. In an example implementation, the database 182 may comprise a plurality of records 183, where each record 183 comprises an audio clip (or signature of the clip) 184, a description of the clip 185 (e.g., the game it is from, when it occurs in the game, etc.), one or more gaming commands 186 associated with the clip, one or more parameter settings 187 associated with the clip, and/or other data associated with the audio clip. Records 183 of the database 182 may be downloadable to, or accessed in real-time by, one of more devices of the GPN 190.

Figure 2A:
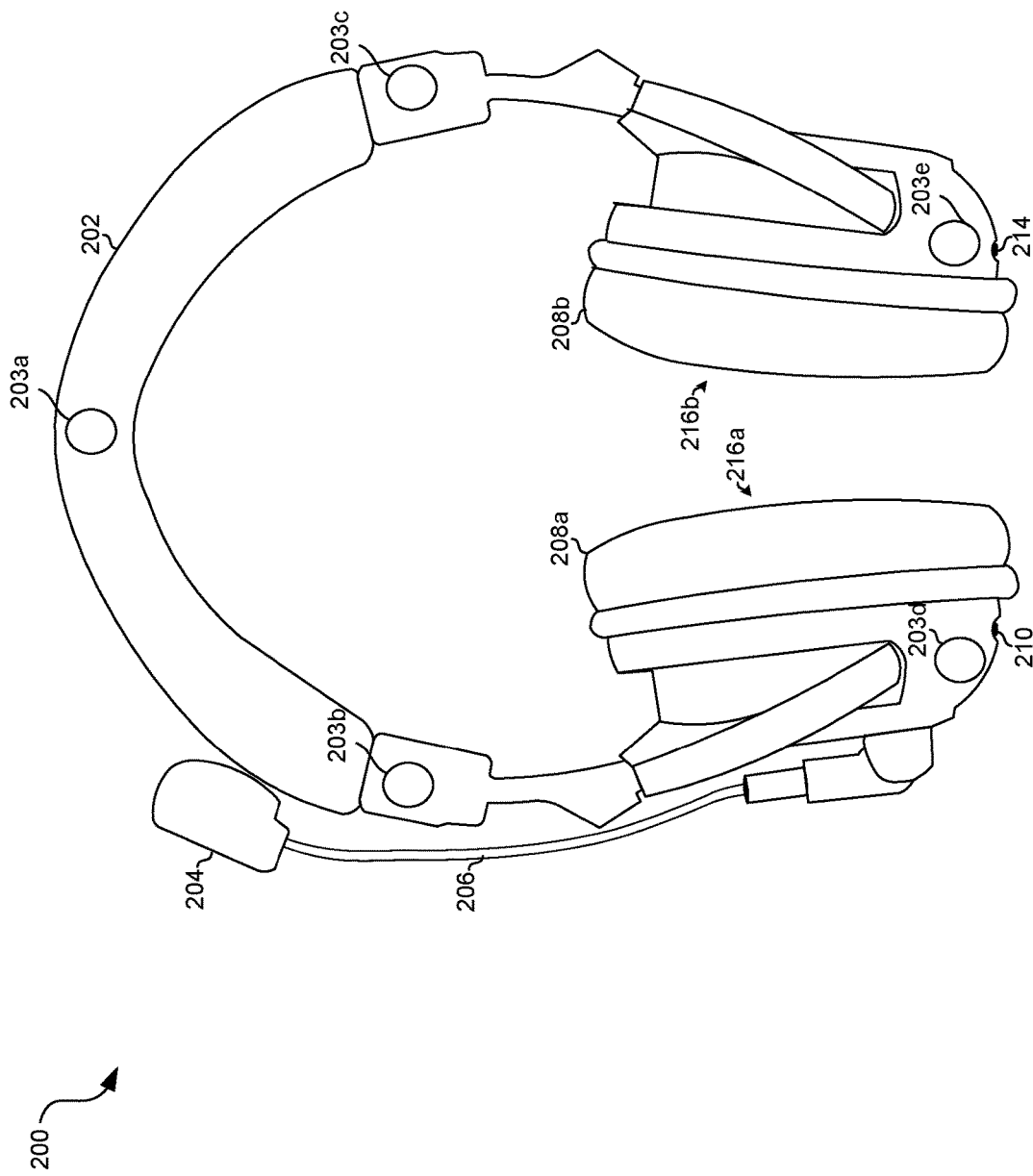
FIGS. 2A and 2B are diagrams that depict two views of an example embodiment of a gaming headset, in accordance with various exemplary embodiments of the disclosure.
Figure 2B:
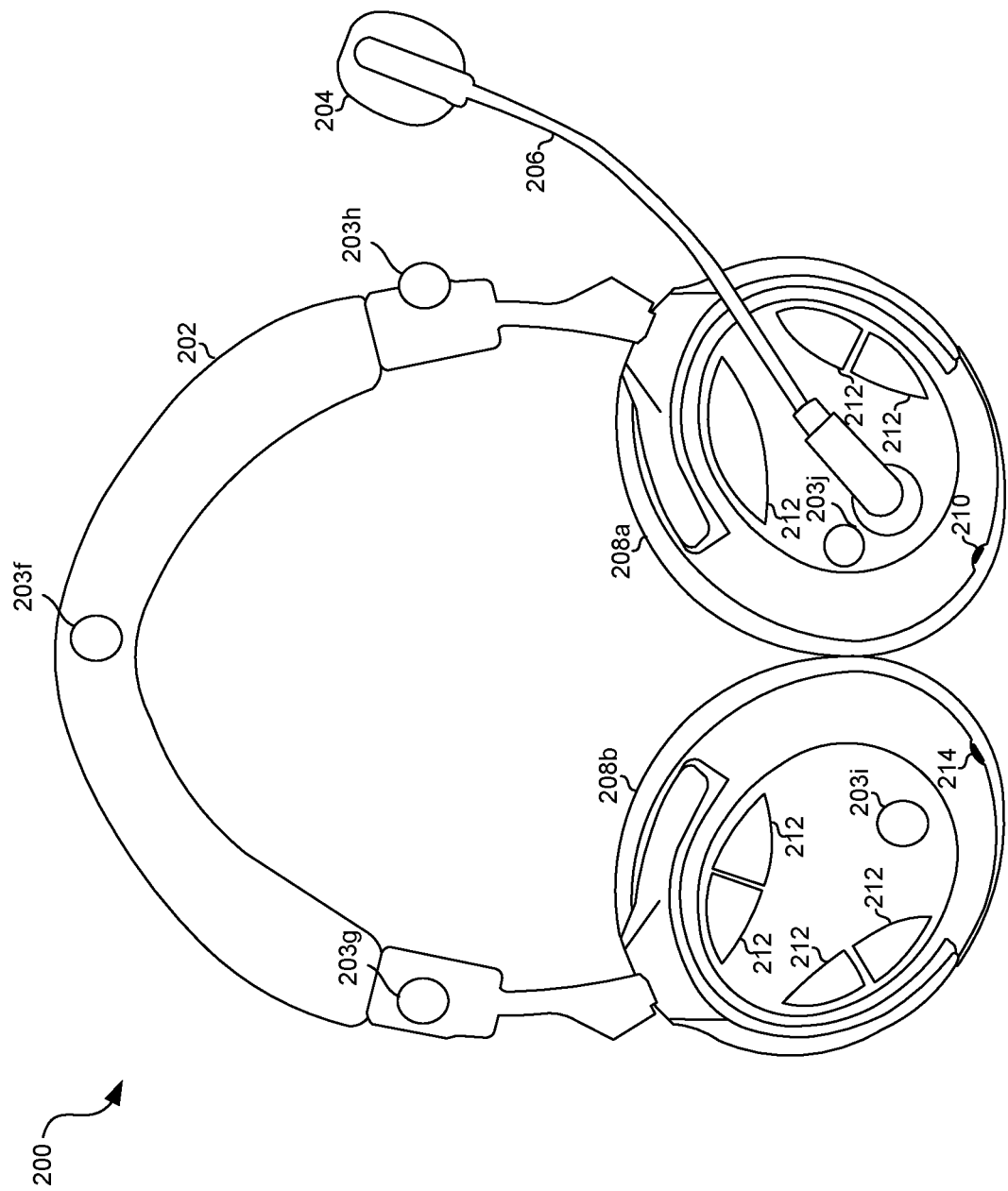

FIGS. 2A and 2B are diagrams that depict two views of an example embodiment of a gaming headset, in accordance with various exemplary embodiments of the disclosure. Referring to FIGS. 2A and 2B, there are shown two views of an example headset 200 that may present audio output by a gaming console such as the console 176. The headset 200 comprises a headband 202, a microphone boom 206 with microphone 204, ear cups 208a and 208b which surround speakers 216a and 216b, connector 210, connector 214, and user controls 212. The headset 200 may also comprise a plurality of environment sensors, namely, 203a, 203b, 203c, 203d, 203e, 203f, 203g, 203h, 203i, 203j. The plurality of environment sensors 203a, 203b, 203c, 203d, 203e, 203f, 203g, 203h, 203i, 203j are collectively and individually referenced as sensor(s) 203. The environment sensors 203a, 203b, 203c, 203d, 203e are illustrated in FIG. 2A and the environment sensors 203f, 203g, 203h, 203i, 203j are illustrated in FIG. 2B.

The connector 210 may be, for example, a 3.5 mm headphone socket for receiving analog audio signals (e.g., receiving chat audio via an Xbox "talkback" cable).

The microphone 204 may comprise suitable logic, circuitry, interfaces and/or code that may be operable to convert acoustic waves (e.g., the voice of the person wearing the headset) to electric signals for processing by circuitry of the headset and/or for output to a device (e.g., console 176, basestation 301, a smartphone, and/or the like) that is in communication with the headset.

The speakers 216a and 216b may comprise circuitry that may be operable to convert electrical signals to sound waves. In accordance with various embodiments of the disclosure, the audio processing circuitry 230 may be operable to generate an alert signal that is converted to converted an audio alert by speakers 216a and 216b. Such an alert signal may be generated whenever a particular condition is detected by one or more of the sensors 203. In some embodiments of the disclosure, game play audio may be muted in one or both of the speakers 216a and 216b when certain conditions are detected by the environment sensors 203.

The user controls 212 may comprise dedicated and/or programmable buttons, switches, sliders, wheels, etc. for performing various functions. Example functions which the controls 212 may be configured to perform include: power the headset 200 on/off, mute/unmute the microphone 204, control gain/volume of, and/or effects applied to, chat audio by the audio processing circuitry of the headset 200, control gain/volume of, and/or effects applied to, game audio by the audio processing circuitry of the headset 200, enable/disable/initiate pairing (e.g., via Bluetooth, Wi-Fi direct, NFC, or the like) with another computing device, and/or the like. Some of the user controls 212 may adaptively and/or dynamically change during gameplay based on a particular game that is being played. Some of the user controls 212 may also adaptively and/or dynamically change during gameplay based on a particular player that is engage in the game play. The connector 214 may be, for example, a USB, thunderbolt, Firewire or other type of port or interface. The connector 214 may be used for downloading data to the headset 200 from another computing device and/or uploading data from the headset 200 to another computing device. Such data may include, for example, parameter settings (described below). Additionally, or alternatively, the connector 214 may be used for communicating with another computing device such as a smartphone, tablet compute, laptop computer, or the like.

The environment sensors 203 may comprise suitable logic, circuitry, interfaces and/or code that may be operable to sense the surrounding environment of the headset 200. Exemplary environment sensors may comprise, for example, a camera, a gyroscope, an accelerometer, a motion sensor, a biometric sensor, a microphone, a heat sensor, an infrared sensor, and so on. One or more of the microphones (e.g., microphone 204 and/or one or more other microphones represented as a sensor 203) may be directional so that the direction of a detected sound may be determined. The sensed information from the environment sensors 203 may be analyzed or assessed in order to determine the conditions of the surrounding environment of the headset 200. The information from the sensors 203 may be combined in order to get a more accurate sense of the conditions of the surrounding environment of the headset 200. For example, a camera 203 may be operable to utilize face detection to determine the number of people that are in the surrounding environment. This information may be combined with audio from the microphone 204 (or 203) and/or a heat signature from an infrared sensor 203 to determine how close the people are to the listener/wearer of the headset. Information stored in the headset 200 may also be utilized to determine the identity of the persons or pets that may have entered the room without the listener of the headset 200 being aware (e.g., because the listener is immersed in game play with corresponding game and chat audio coming through the speakers of the headset). The environment sensors 203 may be positioned at different locations of the headset 200 in order to determine the surrounding environment in front of, to the rear of, and/or to the sides of the listener of the headset.

The operation of the headset 200 may be adjusted based on the detected or determined conditions of the surroundings. For example, if the assessments determine that a person may be standing behind the listener of the headset 200, then the headset 200 may play an audio notification to indicate that the person is standing behind the listener. The headset 200 may also generate a visible alert that may be overlaid on the game display and/or on the display of device 192 during game play. In another example, if the assessment determines that the footsteps of several persons were detected behind the listener of the headset 200, then the headset 200 may play an audio notification to indicate that the footsteps of several persons were detected behind the listener. The headset 200 may also generate a visible alert, audible alert and/or a vibration alert to notify the listener of the detected footsteps. If sound is detected coming from a particular direction, the headset 200 may decrease the volume (possibly completely muting) the speaker facing the direction of the sound so that the listener of the headset 200 may hear the detected sounds.

Figure 2C:
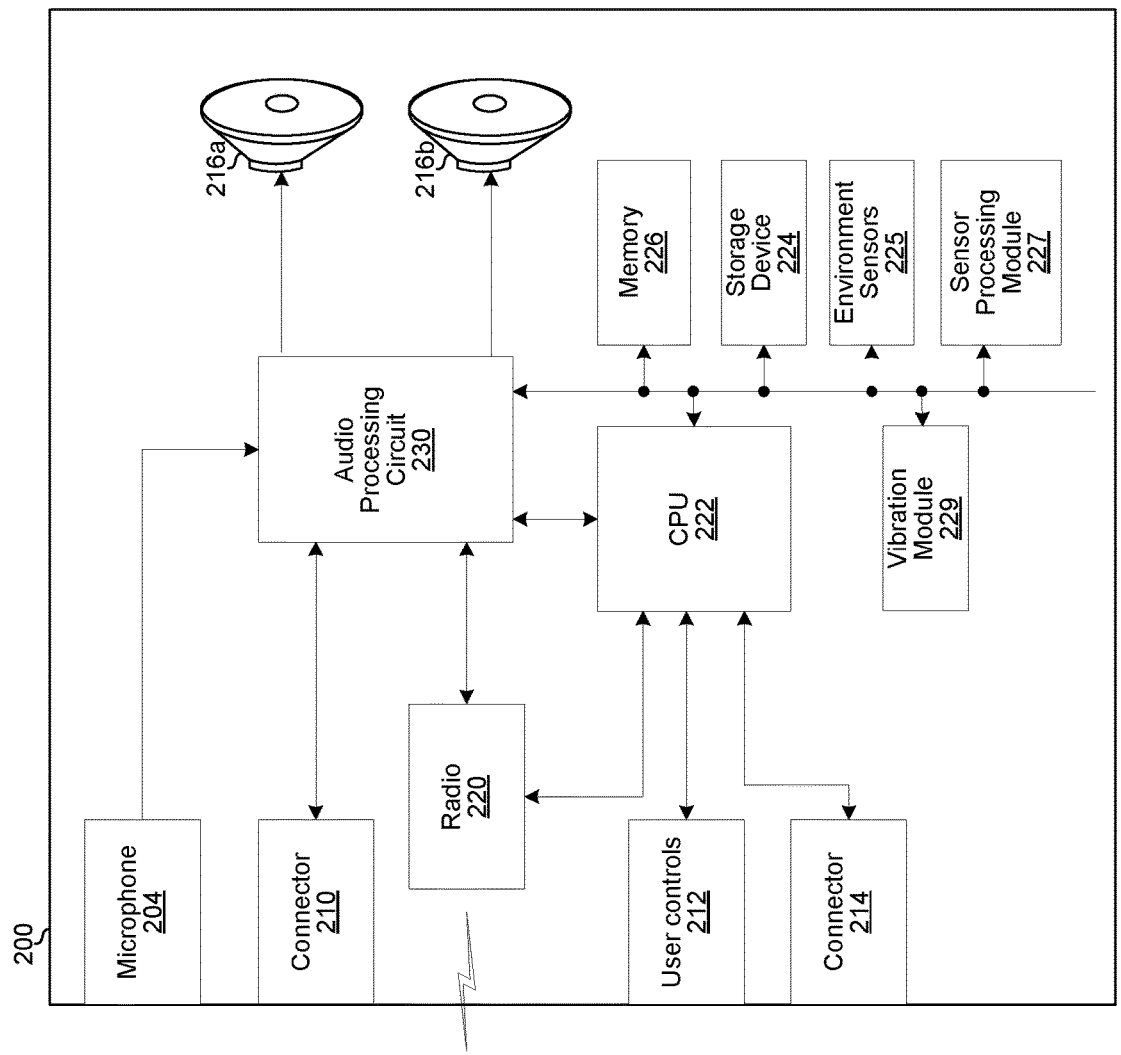
FIG. 2C is a diagram that depicts a block diagram of the example headset of FIGS. 2A and 2B, in accordance with various exemplary embodiments of the disclosure.

FIG. 2C is a diagram that depicts a block diagram of the exemplary headset of FIGS. 2A and 2B, in accordance with various exemplary embodiments of the disclosure. Referring to FIG. 2C, there is shown a headset 200. In addition to the connector 210, user controls 212, connector 214, microphone 204, and speakers 216a and 216b already discussed, there are shown a radio 220, a CPU 222, a storage device 224, a memory 226, and an audio processing circuit 230. FIG. 2C also shows integrated environment sensors 225, and sensor processing module 227, and vibration module 229.

The radio 220 may comprise suitable logic, circuitry, interfaces and/or code that may be operable to communicate in accordance with one or more standardized (such as, for example, the IEEE 802.11 family of standards, NFC, the Bluetooth family of standards, and/or the like) and/or proprietary wireless protocol(s) (e.g., a proprietary protocol for receiving audio from an audio basestation such as the basestation 301).

The CPU 222 may comprise suitable logic, circuitry, interfaces and/or code that may be operable to execute instructions for controlling/coordinating the overall operation of the headset 200. Such instructions may be part of an operating system or state machine of the headset 200 and/or part of one or more software applications running on the headset 200. In some implementations, the CPU 222 may be, for example, a programmable interrupt controller, a state machine, or the like.

The CPU 222 may also be operable to handle operation of the headset 200, which may comprise a plurality of integrated environment sensors 225. The integrated environment sensors 225 may be integrated within the headset 200. The CPU 222 may be operable to dynamically and/or adaptively configure and manage operation of the integrated environment sensors 225 which may acquire information about the surrounding environment of the headset 200. The CPU 222 may also be operable to dynamically and/or adaptively configure and manage operation of one or more the environment sensors, which are located external to the headset 200, and may acquire information about the surrounding environment of the headset 200. The CPU 222 may be operable to utilize data stored in the storage device 224 and/or the memory 226 to configure and/or manage operation of the integrated environment sensors 225 and also the external environment sensors. The CPU 222 may be operable to combine information from a plurality of the sensors in order to get a more accurate sense of the conditions of the surrounding environment of the headset 200.

The storage device 224 may comprise suitable logic, circuitry, interfaces and/or code that may comprise, for example, FLASH or other nonvolatile memory, which may be operable to store data comprising operating data, configuration data, settings, and so on, which may be used by the CPU 222 and/or the audio processing circuit 230. Such data may include, for example, parameter settings that affect processing of audio signals in the headset 200 and parameter settings that affect functions performed by the user controls 212. For example, one or more parameter settings may determine, at least in part, a gain of one or more gain elements of the audio processing circuit 230. As another example, one or more parameter settings may determine, at least in part, a frequency response of one or more filters that operate on audio signals in the audio processing circuit 230. As another example, one or more parameter settings may determine, at least in part, whether and which sound effects are added to audio signals in the audio processing circuit 230 (e.g., which effects to add to microphone audio to morph the user's voice). Example parameter settings which affect audio processing are described in the co-pending U.S. patent application Ser. No. 13/040,144 titled "Gaming Headset with Programmable Audio" and published as US2012/0014553, the entirety of which is hereby incorporated herein by reference. Particular parameter settings may be selected autonomously by the headset 200 in accordance with one or more algorithms, based on user input (e.g., via controls 212), and/or based on input received via one or more of the connectors 210 and 214.

The memory 226 may comprise suitable logic, circuitry, interfaces and/or code that may comprise volatile memory used by the CPU 222 and/or audio processing circuit 230 as program memory, for storing runtime data, etc. In this regard, the memory 226 may comprise information and/or data that may be utilized to control operation of the integrated environment sensors 225 and/or the external environment sensors, which are utilized to sense the surrounding environment of the headset 200.

The audio processing circuit 230 may comprise suitable logic, circuitry, interfaces and/or code that may be operable to perform audio processing functions such as volume/gain control, compression, decompression, encoding, decoding, introduction of audio effects (e.g., echo, phasing, virtual surround effect, etc.), and/or the like. As described above, the processing performed by the audio processing circuit 230 may be determined, at least in part, by which parameter settings have been selected. The processing performed by the audio processing circuit 230 may also be determined based on default settings, player preference, and/or by adaptive and/or dynamic changes to the game play environment. The processing may be performed on game, chat, and/or microphone audio that is subsequently output to speaker 216a and 216b. Additionally, or alternatively, the processing may be performed on chat audio that is subsequently output to the connector 210 and/or radio 220.

The integrated environment sensors 225 may be substantially similar to the 203a, 203b, 203c, 203d, 203e, 203f, 203g, 203h, 203i, 203j, which are shown and described with respect to, for example, FIGS. 2A and 2C. The external environment sensors may be substantially similar to the integrated environment sensors 225. The integrated environment sensors 225 may comprise one or more environment sensors, which may comprise suitable logic, circuit, interfaces and/or code that may be operable to sense the surrounding environment of the headset 200. Exemplary integrated environment sensors 225 may comprise, for example, a camera, a gyroscope, an accelerometer, a motion sensor, a biometric sensor, a microphone, a heat sensor, an infrared sensor, and so on. One or more of the microphones 204 may comprise directional microphones. The directional microphones may be operable to sense sounds in particular directions in order to more accurately determine a direction of a sound source within the surrounding environment of the headset 200.

In an example implementation, the headset 200 may be connected to a device (e.g., 192) with voice telephony and music capabilities. During a voice call, the headset 200, the device, or combination of the two may automatically detect that a call is in progress (e.g., in response to the user pressing an off-hook button on the headset or on the device itself) and/or that the wearer of the headset is talking (e.g., when level of captured vocal band audio in the direction of the user's mouth is above a threshold). In response to detecting that a call is in progress and/or that the wearer of the headset 200 is talking, the directionality of the microphone 204 may be controlled (e.g., mechanically through motors, servos, or the like and/or electrically through controlling gain and phase of multiple elements of a microphone array) for optimal capture of the wearer's voice. On the other hand, when the headset 200, device, or combination of the two detects that a call is not in progress (e.g., based on the user pressing an on-hook button on the device or on the headset 200, and/or based on the fact that audio having characteristics indicating that the headset is currently outputting music or some other content other than a voice call) the directionality of the microphone 204 may be controlled to point in a different direction. For example, when the wearer is listening to music the directionality of the microphone may be controlled to point behind the wearer of the headset 200. This may be useful, for example, so that the wearer can hear someone approaching from behind them (e.g., to hear bikes or cars or other persons approaching while jogging and listening to music).

In accordance with various embodiments of the disclosure, the integrated environment sensors 225 and/or the external environment sensors may be operable to sense and capture information that is related to the surrounding environment of the headset 200. The headset 200 may be operable to assess the information and may adjust operation of the headset 200 based on the assessment. For example, the headset 200 may be operable to alert or warn a listener of the headset 200 that there may be a particular level of threat, that another person may be shadowing the listener, and/or that there may be some movement activity in the background based on the assessment. The warning may indicate the level of the threat (e.g., whether or not the wearer of the headset is in imminent danger). The headset 200 may be operable to generate different types of notifications to alert the listener of the headset 200. For example, an audio alert, a visual alert and/or a vibration alert may be generated by the headset 200 in order to get the attention of the listener and warn the listener of the existing condition of the sensed surrounding environment. The audio alert may comprise a tone, multiple tones, and any audible signal, which may be generated by the audio processing circuit 230 and output by the speakers 216a, 216b. In some embodiments of the disclosure, the volume of the game play audio may be decreased by the headset 200 when the integrated environment sensors 225 and/or the external environment sensors detect a particular condition. The lowering of the game play audio may enable the listener of the headset 200 to more readily hear sounds in the environment. For example, approaching footsteps or vehicles may be more readily heard when the volume of the game play audio is lowered. In some embodiments of the disclosure, the volume of the game play audio may be muted to more clearly hear sounds that may be detected by the microphone 204. The visual alert may be presented on a display that is being utilized to present the game play and/or on a second screen communication device (e.g., device 192).

The vibration module 229 may comprise suitable logic, circuitry, interfaces and/or code that may be operable to generate a vibration signal in response to a condition that is detected by the integrated environment sensors 225 and/or the external environment sensors.

The sensor processing module 227 may comprise suitable logic, circuitry, interfaces and/or code that may be operable to process signals that are received from the integrated environment sensors 225 and/or the external environment sensors. The sensor processing module 227 may control or adjust operation of the headset 200 to alert or notify a listener of the headset of a condition based on results generated from the processing of the signals from the integrated environment sensors 225 and/or the external environment sensors.

Figure 3A:
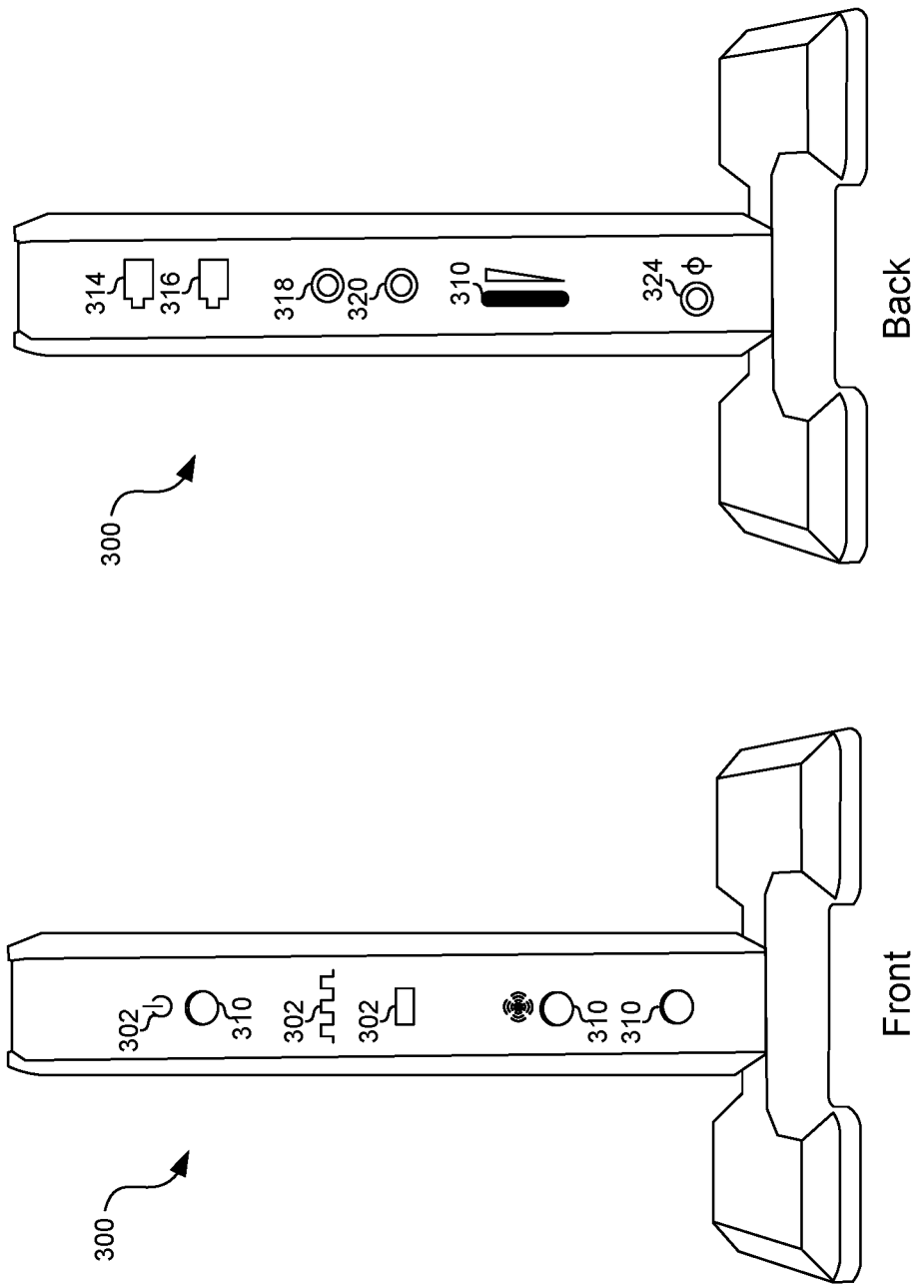
FIG. 3A is a diagram that depicts two views of an example embodiment of an audio basestation, in accordance with various exemplary embodiments of the disclosure.

FIG. 3A is a diagram that depicts two views of an example embodiment of an audio basestation, in accordance with various exemplary embodiments of the disclosure. Referring to FIG. 3A, there is shown an exemplary embodiment of an audio basestation 301. The basestation 301 comprises status indicators 302, user controls 310, power port 324, and audio connectors 314, 316, 318, and 320.

The audio connectors 314 and 316 may comprise digital audio in and digital audio out (e.g., S/PDIF) connectors, respectively. The audio connectors 318 and 320 may comprise a left "line in" and a right "line in" connector, respectively. The controls 310 may comprise, for example, a power button, a button for enabling/disabling virtual surround sound, a button for adjusting the perceived angles of the speakers when the virtual surround sound is enabled, and a dial for controlling a volume/gain of the audio received via the "line in" connectors 318 and 320. The status indicators 302 may indicate, for example, whether the audio basestation 301 is powered on, whether audio data is being received by the basestation 301 via connectors 314, and/or what type of audio data (e.g., Dolby Digital) is being received by the basestation 301.

Figure 3B:
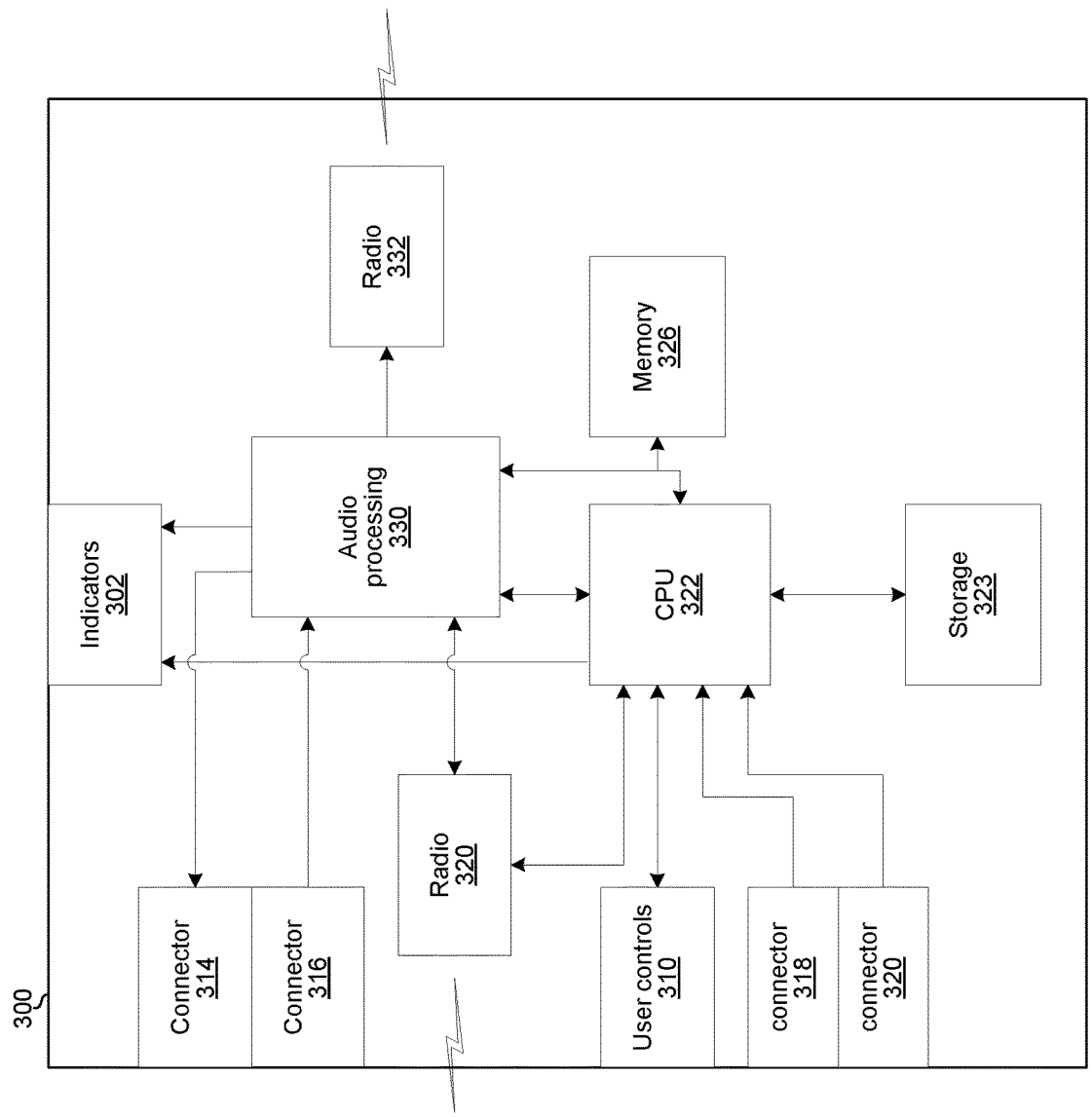
FIG. 3B is a diagram that depicts a block diagram of the audio basestation, in accordance with various exemplary embodiments of the disclosure.

FIG. 3B is a diagram that depicts a block diagram of the audio basestation 301, in accordance with various exemplary embodiments of the disclosure. Referring to FIG. 3B, there is shown an exemplary embodiment of an audio basestation 301. In addition to the user controls 310, indicators 302, and connectors 314, 316, 318, and 320 described above, the block diagram additionally shows a CPU 322, a storage device 323, a memory 326, a radio 320, an audio processing circuit 330, and a radio 332.

The radio 320 comprises suitable logic, circuitry, interfaces and/or code that may be operable to communicate in accordance with one or more standardized (such as the IEEE 802.11 family of standards, the Bluetooth family of standards, NFC, and/or the like) and/or proprietary (e.g., proprietary protocol for receiving audio protocols for receiving audio from a console such as the console 176) wireless protocols.

The radio 332 comprises suitable logic, circuitry, interfaces and/or code that may be operable to communicate in accordance with one or more standardized (such as, for example, the IEEE 802.11 family of standards, the Bluetooth family of standards, and/or the like) and/or proprietary wireless protocol(s) (e.g., a proprietary protocol for transmitting audio to the headphones 200).

The CPU 322 comprises suitable logic, circuitry, interfaces and/or code that may be operable to execute instructions for controlling/coordinating the overall operation of the audio basestation 301. Such instructions may be part of an operating system or state machine of the audio basestation 301 and/or part of one or more software applications running on the audio basestation 301. In some implementations, the CPU 322 may be, for example, a programmable interrupt controller, a state machine, or the like.

The storage 323 may comprise, for example, FLASH or other nonvolatile memory for storing data which may be used by the CPU 322 and/or the audio processing circuitry 330. Such data may include, for example, parameter settings that affect processing of audio signals in the basestation 301. For example, one or more parameter settings may determine, at least in part, a gain of one or more gain elements of the audio processing circuitry 330. As another example, one or more parameter settings may determine, at least in part, a frequency response of one or more filters that operate on audio signals in the audio processing circuitry 330. As another example, one or more parameter settings may determine, at least in part, whether and which sound effects are added to audio signals in the audio processing circuitry 330 (e.g., which effects to add to microphone audio to morph the user's voice). Example parameter settings which affect audio processing are described in the co-pending U.S. patent application Ser. No. 13/040,144 titled "Gaming Headset with Programmable Audio" and published as US2012/0014553, the entirety of which is hereby incorporated herein by reference. Particular parameter settings may be selected autonomously by the basestation 301 in accordance with one or more algorithms, based on user input (e.g., via controls 310), and/or based on input received via one or more of the connectors 314, 316, 318, and 320.

The memory 326 may comprise volatile memory used by the CPU 322 and/or audio processing circuit 330 as program memory, for storing runtime data, etc.

The audio processing circuit 330 may comprise suitable logic, circuitry, interfaces and/or code that may be operable to perform audio processing functions such as volume/gain control, compression, decompression, encoding, decoding, introduction of audio effects (e.g., echo, phasing, virtual surround effect, etc.), and/or the like. As described above, the processing performed by the audio processing circuit 330 may be determined, at least in part, by which parameter settings have been selected. The processing may be performed on game and/or chat audio signals that are subsequently output to a device (e.g., headset 200) in communication with the basestation 301. Additionally, or alternatively, the processing may be performed on a microphone audio signal that is subsequently output to a device (e.g., console 176) in communication with the basestation 301.

Figure 4:
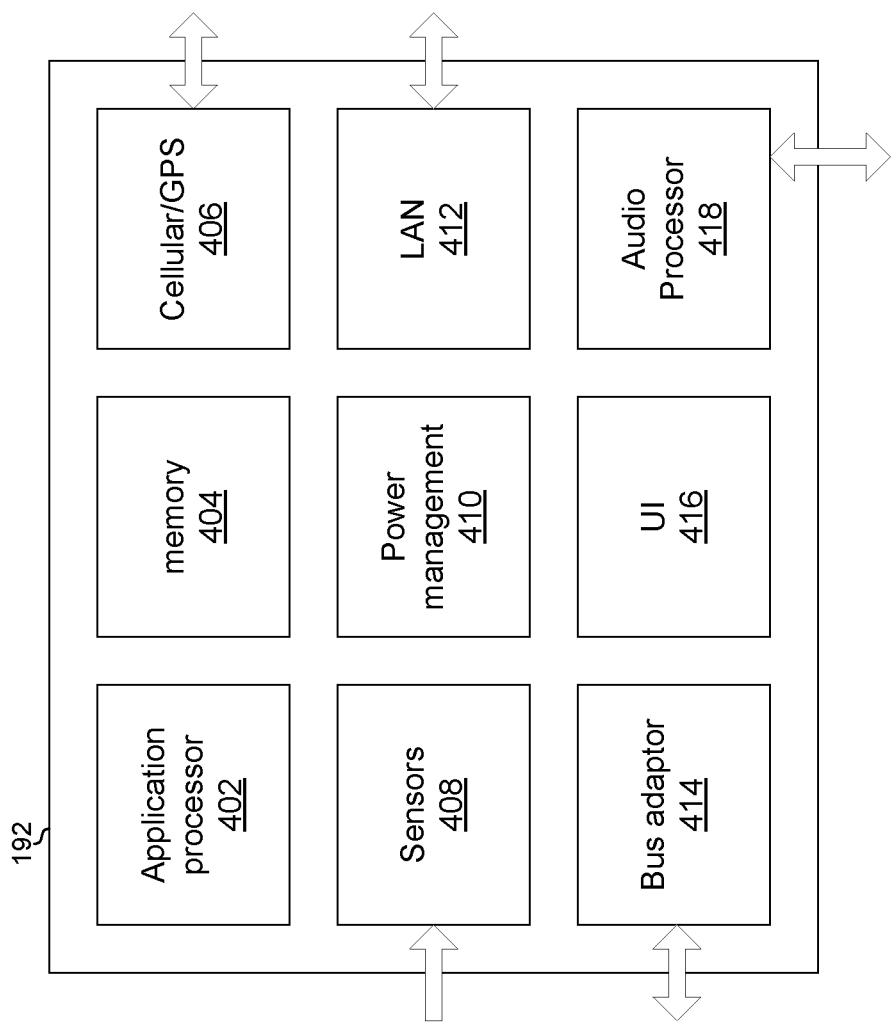
FIG. 4 is a block diagram of an exemplary multi-purpose device, in accordance with various exemplary embodiments of the disclosure.

FIG. 4 is a block diagram of an exemplary multi-purpose device 192, in accordance with various exemplary embodiments of the disclosure. The example multi-purpose device 192 comprises an application processor 402, memory subsystem 404, a cellular/GPS networking subsystem 406, sensors 408, power management subsystem 410, LAN subsystem 412, bus adaptor 414, user interface subsystem 416, and audio processor 418.

The application processor 402 comprises suitable logic, circuitry, interfaces and/or code that may be operable to execute instructions for controlling/coordinating the overall operation of the multi-purpose device 192 as well as graphics processing functions of the multi-purpose device 1922. Such instructions may be part of an operating system of the console and/or part of one or more software applications running on the console.

The memory subsystem 404 comprises volatile memory for storing runtime data, nonvolatile memory for mass storage and long-term storage, and/or a memory controller which controls reads/writes to memory.

The cellular/GPS networking subsystem 406 comprises suitable logic, circuitry, interfaces and/or code that may be operable to perform baseband processing and analog/RF processing for transmission and reception of cellular and GPS signals.

The sensors 408 comprise, for example, a camera, a gyroscope, an accelerometer, a biometric sensor, environment sensors and/or the like.

The power management subsystem 410 comprises suitable logic, circuitry, interfaces and/or code that may be operable to manage distribution of power among the various components of the multi-purpose device 192.

The LAN subsystem 412 comprises suitable logic, circuitry, interfaces and/or code that may be operable to perform baseband processing and analog/RF processing for transmission and reception of cellular and GPS signals.

The bus adaptor 414 comprises suitable logic, circuitry, interfaces and/or code that may be operable for interfacing one or more internal data busses of the multi-purpose device with an external bus (e.g., a Universal Serial Bus) for transferring data to/from the multi-purpose device via a wired connection.

The user interface subsystem 416 comprises suitable logic, circuitry, interfaces and/or code that may be operable to control and relay signals to/from a touchscreen, hard buttons, and/or other input devices of the multi-purpose device 192.

The audio processor 418 comprises suitable logic, circuitry, interfaces and/or code that may be operable to process (e.g., digital-to-analog conversion, analog-to-digital conversion, compression, decompression, encryption, decryption, resampling, etc.) audio signals. The audio processor 418 may be operable to receive and/or output signals via a connector such as a 3.5 mm stereo and microphone connector.

Figure 5:
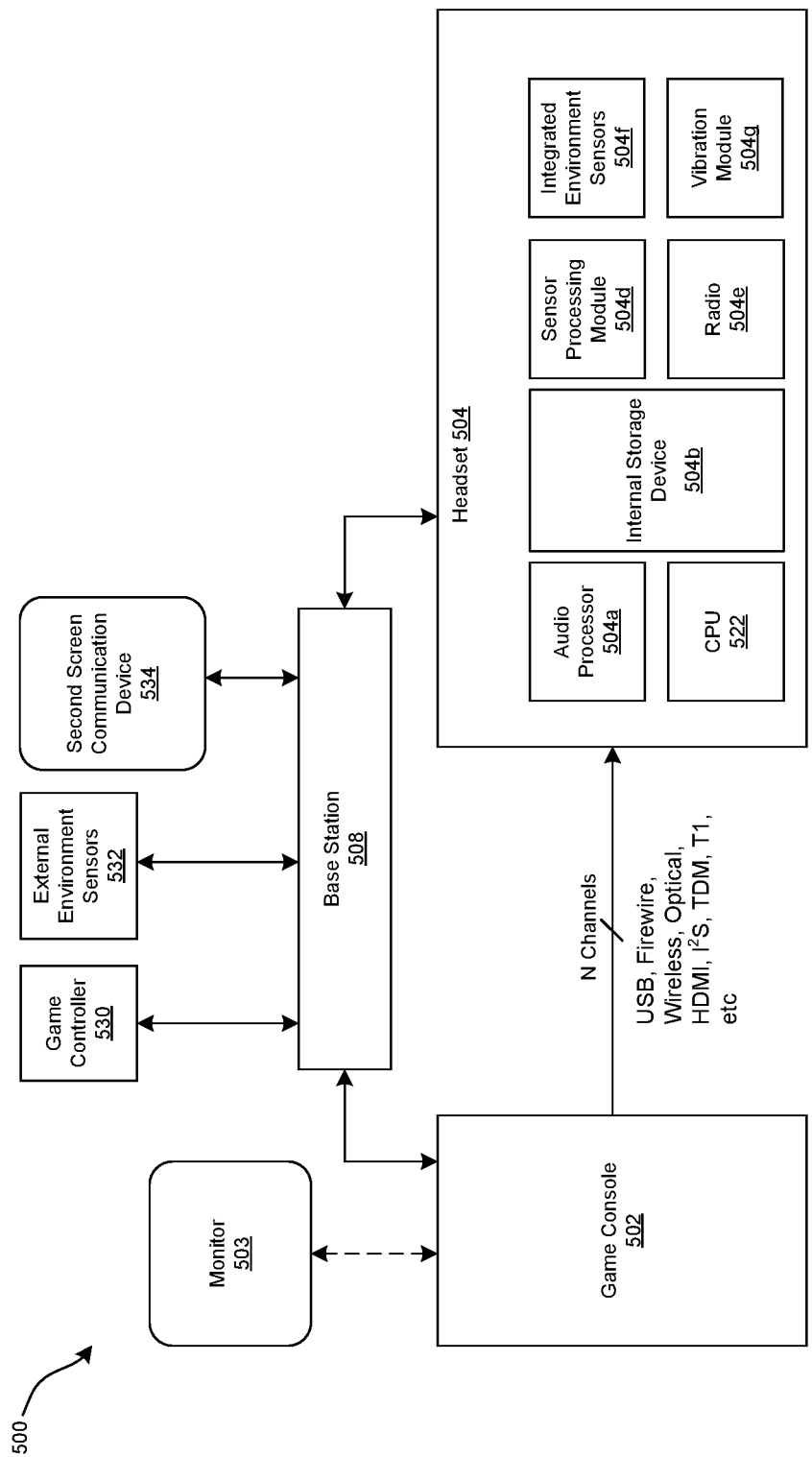
FIG. 5 is a block diagram illustrating an exemplary subsystem that may be utilized for adjusting the operation of a headset based on the sensed environment of the headset, in accordance with an embodiment of the disclosure.

FIG. 5 is a block diagram illustrating an exemplary subsystem that may be utilized for adjusting the operation of a headset based on the sensed environment of the headset, in accordance with an embodiment of the disclosure. Referring to FIG. 5, there is shown a game console 502, a monitor 503, a headset 504, a base station 508, a game controller 530, external environment sensors 532, and a second screen communication device 534. The headset 504 may comprise an audio processor 504a, an internal storage device 504b, a sensor processing module 504d, a radio 504e, integrated environment sensors 504f, vibration module 504g, and a CPU 522.

The game console 502 may comprise suitable logic, circuitry, interfaces and/or code that may be operable to present a game to, and also enable game play interaction between, one or more local players and/or one or more remote players. The game console 502 may be substantially similar to the game console 176, which is shown and described with respect to, for example, FIG. 1A. The game console 502 may be operable to generate output video signals for a game over a video channel and output corresponding audio signals for the game over one or more of a plurality of audio channels. Exemplary audio channels may comprise a center (CTR) channel, a front right (FR) channel, a front left (FL) channel, a rear right (RR) channel, a rear left (RL) channel, a side right (SR) channel, and a side left (SL) channel. The audio and video generated from the game console 502 during game play may be communicated to the monitor 503 to be displayed by the monitor 503.

The monitor 503 may comprise suitable logic, circuitry, interfaces and/or code that may be operable to display corresponding audio and video that may be received from the game console 502 for the game during game play. The monitor 503 may comprise a television (TV), computer monitor, laptop display, and so on.

The headset 504 may comprise suitable logic, circuitry, interfaces and/or code that may be operable to receive the corresponding audio signals for the game. The headset 504 may be substantially similar to the headset 200, which is shown and described with respect to, for example, FIGS. 2A, 2B and 2C. The headset 504 may be operable to monitor and analyze the audio signals detected within the surrounding environment of the headset 504 and may adjust one or more functions of the headset 504 in order to alert the listener of the headset 504 of the conditions of surrounding environment. The headset 504 may be controlled so that it generates a notification that alerts the listener about the condition of the surrounding environment of the headset 504. The headset 504 may determine directionality, frequency or pitch, frequency of occurrence and/or gain of the detected sounds and may, for example, adjust the headset volume and/or generate an alert to notify the listener that a person or vehicle may be approaching from the determined direction. The headset 504 may also be operable to combine information from a plurality of different sensors to more accurately determine the surrounding environment of the headset 504.

The audio processor 504a may comprise suitable logic, circuitry, interfaces and/or code that may be operable to monitor the audio signals within the surrounding environment of the headset. The audio processor 504a may be substantially similar to the audio processing circuit 230, which is shown and described with respect to FIG. 2C. The audio processor 504a may be operable to utilize signal analysis to determine the characteristics of sounds in the monitored plurality of audio channels. The audio processor 504a may detect certain sounds and characteristics such as directionality, frequency or pitch, frequency of occurrence and/or intensity. The results of the analysis by the audio processor 504a may be utilized to control operation or functions of the headset 504 and/or to generate an alert to gain the attention of the listener of the headset 504. For example, the volume of the headset 504 may be decreased or muted in instances where the audio processor 504a may detect the footsteps of a person or animal such as the listener's pet.

The internal storage device 504b may comprise one or more suitable devices that may comprise suitable logic, circuitry, interfaces and/or code that may be operable to store information for a game and also store configuration information for the integrated environment sensors 504f and/or the external environment sensors 532. The headset 504 may utilized to stored information and/or configuration information to configure and/or communicate with the integrated environment sensors 504f and/or the external environment sensors 532. The internal storage device 504b may be substantially similar to the storage device 224, which is shown and described with respect to FIG. 2C.

The CPU 522 may comprise suitable logic, circuitry, interfaces and/or code that may be operable to execute instructions for controlling, managing and/or coordinating the overall operation of the headset 504. In this regard, the CPU 522 may be operable to control, manage and coordinate operation of the components in the headset 504, which comprises the audio processor 504a, the internal storage device 504b, the sensor processing module 504d, the radio 504e, the integrated environment sensors 504f, and the vibration module 504g. The CPU 522 may also be operable to coordinate and manage operations between the headset 504, the game console 502, the game controller 530, the external environment sensors 532 and the second screen communication device 534. The CPU 522 may be substantially similar to the CPU 222, which is shown and described with respect to, for example, FIG. 2C. In an exemplary embodiment of the disclosure, the CPU 522 may be operable to control or adjust operation of the headset 504 and/or cause an alert to be generated based on surrounding environment information that may be received from the integrated environment sensors 504f and/or the external environment sensors 532.

The sensor processing module 504d may comprise suitable logic, circuitry, interfaces and/or code that may be operable to process surrounding environment information that may be received from the integrated environment sensors 504f and/or the external environment sensors 532. The sensor processing module 504d may also be operable to process audio information received from the audio processor 504a, which corresponds to sounds that may be detected within the surrounding environment of the headset 504. The sensor processing module 504*d* may be operable to combine surrounding environment information that may be received from the integrated environment sensors 504*f*, the audio processor 504*a*, and/or the external environment sensors 532 in order to more accurately determine the conditions of the surrounding environment of the headset 504.

The radio 504*e* may comprise suitable logic, circuitry interfaces and/or code that may be operable to communicate surrounding environment information between the headset 504, the external environment sensors 532 and second screen communication device 534. The radio 504*e* may be substantially similar to the radio 220, which is shown and described with respect to, for example, FIG. 2C. In accordance with an embodiment of the disclosure, the radio 504*e* may be utilized to communicate visual alerts from the headset 504 to the game console 502. In accordance with another embodiment of the disclosure, the radio 504*e* may be utilized to communicate visual alerts from the headset 504 to the second screen communication device 534. The visual alerts may comprise information that may be utilized to notify the listener of the headset 504 about the surrounding environment of the headset 504. The visual alerts that are communicated to the game console 502 may be overlaid on the game play that is presented on the monitor 503.

The vibration module 504*g* may comprise suitable logic, circuitry interfaces and/or code that may be operable to provide a vibration that may be utilized to alert the listener of the headset 504 of the conditions of the surrounding environment of the headset 504. The CPU 522 may be operable to trigger the vibration module 504*g* to vibrate in instances when the listener of the headset 504 has to be alerted of the conditions of the surrounding environment of the headset 504.

The base station 508 may comprise suitable logic, circuitry interfaces and/or code that may be operable to provide wireless connectivity between the game console 502, the headset 504, the game controller 530, the external environment sensors 532 and the second screen communication device 534. The base station 508 may be substantially similar to the base station 301, which is shown and described with respect to, for example, FIGS. 1B and 1C.

The game controller 530 may comprise suitable logic, circuitry interfaces and/or code that may enable a player to engage in game play and manipulate the in-game action (e.g., control the listener's on-screen character). In this regard, the game controller 530 may be operable to communicate with the headset 504 via, for example, the base station 508.

The integrated environment sensors 504*f* may comprise one or more environment sensors within the headset 504, which may comprise suitable logic, circuit, interfaces and/or code that may be operable to sense the surrounding environment of the headset 504. The sensed surrounding environment information from the sensors in the integrated environment sensors 504*f* may be communicated to the processing module 504*d* for processing. Exemplary integrated environment sensors 504*f* may comprise, for example, cameras, gyroscopes, accelerometers, motion sensors, biometric sensors, microphones, heat sensors, infrared sensors, and so on. The integrated environment sensors 504*f* may be substantially similar to the integrated environment sensors 225, which and shown and described with respect to, for example, FIG. 2C.

The external environment sensors 532 may comprise one or more environment sensors, which are located external to the headset 504, and which may comprise suitable logic, circuit, interfaces and/or code that may be operable to sense the surrounding environment of the headset 504. The sensed surrounding environment information from the sensors in the external environment sensors 532 may be communicated to the sensor processing module 504*d* for processing. Exemplary external environment sensors 532 may comprise, for example, cameras, gyroscopes, accelerometers, motion sensors, biometric sensors, microphones, heat sensors, infrared sensors, and so on. The integrated environment sensors 504*f* may be substantially similar to the integrated environment sensors 225, which and shown and described with respect to, for example, FIG. 2C. The external environment sensors 532 may be located at different positions in, for example, a game room. For example, the external environment sensors 532 may be located on walls, the ceiling, on desk, tables and so on in the game room. The external environment sensors 532 may be communicate wirelessly with the basestation 508 in order to communicate with the headset 504.

The second screen communication device 534 may comprise suitable logic, circuitry, interfaces and/or code that may be operable to display a visual alert that may be generated by the headset 504. The visual alert may comprise visual information that notifies the listener of the headset of the condition of the surrounding environment of the headset 504. In this regard, the headset 504 may be operable to communicate information for the visual alert to the second screen communication device 534 via the base station 508.

In operation, the headset 504 may be operable to configure the integrated environment sensors 504*f* and/or the external environment sensors 532 to sense surrounding environment of the headset. The sensor processing module 504*d* may be operable to process the information received from the integrated environment sensors 504*f* and/or the external environment sensors 532. Based on the processed information, the operation and/or a function of the headset 504 may be adjusted. For example, the headset 504 may be adjusted or configured to generate one or more notifications comprising an audio alert, a visual alert and/or a vibration alert in order to notify the listener of the headset 504 of the sensed surrounding environment of the headset 504.

In accordance with an embodiment of the disclosure, the visual alert may be presented on the monitor 503, which is being utilized to present the game play. In accordance with another embodiment of the disclosure, the visual alert may be presented on the second screen communication device 534 via the base station 508. The CPU 522 may also be operable to adjust a volume of the headset based on the determined condition of the surrounding environment of the headset 504. In this regard, the volume of the headset 504 may be increased, decreased, muted and un-muted based on the determined condition of the surrounding environment. For example, in instances when the sensor processing module 504*d* in headset 504 determines that the listener of the headset 504 may be crossing a busy intersection based on the input from the sensors, the headset 504 may be muted when the listener crosses the intersection. In another example, in instances when the sensor processing module 504*d* in headset 504 determines that someone or something is approaching the listener of the headset 504, the headset 504 may present an audio alert such as a tone, and may decrease the volume of the headset so that the listener may hear the approaching person or thing.

FIG. 6 is a flow diagram illustrating exemplary steps for providing headset with integrated environment sensor, in accordance with various exemplary embodiments of the disclosure. Referring to FIG. 6, there is shown a flow chart 600 comprising a plurality of exemplary steps, namely, 602 through 608. In step 602, the headset configures the integrated environment sensors and/or the external environment sensors to sense the surrounding environment of the headset. In step 604, the headset receives corresponding sensed surrounding environment information from the integrated environment sensors and/or the external environment sensors. In step 606, the headset processes the received corresponding sensed surrounding environment information. In step 608, the headset adjusts operation and/or function of the headset such as decrease the volume of the headset, and/or generates an alert such as an audio alert, a visual alert, and/or vibration alert based on the processed corresponding sensed surrounding environment information.

In accordance with an exemplary embodiment of the disclosure, an electronic device (e.g., headset 200 and/or basestation 300) may receive audio from an audio source (e.g., console 176) and output the audio via speakers of the device. While outputting the audio via the speakers, the device may sense its surrounding environment, and adjust its operation, based on the sensed environment, to alert a listener using the device (e.g., a listener wearing headset 200 and listening to game and/or chat audio). The adjustment may comprise generation of one or more audio, visual, and/or vibration notifications to the listener using the device. The device may output a visual alert for presentation on a display (e.g., 503) that presents video corresponding to the receive audio and/or on a second screen communication device (e.g., 534). A volume of the audio output via the speakers may be adjusted based on the sensed surrounding environment. The device may detect whether a first condition is present in the surrounding environment, decrease the volume when the first condition is detected in the surrounding environment, and increase the volume when the first condition is not detected in the surrounding environment. The device may detect whether a first condition is present in the surrounding environment, mute the volume when a first condition is detected in the surrounding environment, and unmute the volume when the first condition is not detected in the surrounding environment. The device may comprise one or more integrated sensors (e.g., 203) that are operable to perform the sensing of the surrounding environment. The device may receive external sensed information for the surrounding environment from one or more sensors (e.g., 532) that are external to the device. The device may generate one or more notifications to the listener using the device based on the external sensed information.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Throughout this disclosure, the use of the terms dynamically and/or adaptively with respect to an operation means that, for example, parameters for, configurations for and/or execution of the operation may be configured or reconfigured during run-time (e.g., in, or near, real-time) based on newly received or updated information or data. For example, an operation within a transmitter and/or a receiver may be configured or reconfigured based on, for example, current, recently received and/or updated signals, information and/or data.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A method, comprising:
   generating, via one or more sensors of a headset, a heat signature of an area surrounding a headset user, wherein the one or more sensors are on a back side of a headband that is configured to extend over a top of a head of the headset user;
   receiving, via a microphone of the headset, an audio input from the area surrounding the headset user; and
   determining, according to the heat signature and the audio input, a presence of a person in the area surrounding the headset user.

2. The method according to claim 1, wherein the method comprises:
   reducing a volume of one or more speakers of the headset according to the presence of the person in the area surrounding the headset user.

3. The method according to claim 1, wherein the method comprises:
   determining, according to the audio input, an identity of the person in the area surrounding the headset user.

4. The method according to claim 1, wherein the one or more sensors comprise a sensor in each ear cup of the headset.

5. The method according to claim 1, wherein the method comprises:
sensing a direction of the person; and
reducing a volume of a speaker of the headset in the determined direction.

6. The method according to claim 1, wherein the method comprises:
communicating, according to the heat signature, a visual display.

7. The method according to claim 1, wherein the method comprises:
generating a notification to the headset user according the presence of the person in the area surrounding the headset user.

8. The method according to claim 7, wherein the notification comprises one or more of an audio alert and a vibration alert.

9. The method according to claim 1, wherein the one or more sensors comprises an infrared sensor.

10. A headset, comprising:
one or more sensors operable to generate a heat signature of an area surrounding a headset user, wherein the one or more sensors are on a back side of a headband that is configured to extend over a top of a head of the headset user;
a microphone operable to receive an audio input from the area surrounding the headset user; and
a processor operable to determine, according to the heat signature and the audio input, a presence of a person in the area surrounding the headset user.

11. The headset according to claim 10, wherein:
the headset comprises two speakers, and
the processor is operable to reduce a volume of one or both speakers according to the presence of the person in the area surrounding the headset user.

12. The headset according to claim 10, wherein the processor is operable to determine, according to the audio input, an identity of the person in the area surrounding the headset user.

13. The headset according to claim 10, wherein:
the headset comprises two ear cups, and
the one or more sensors comprise a sensor in each ear cup.

14. The headset according to claim 10, wherein:
the headset comprises two speakers, and
the processor is operable to:
sense a direction of the person, and
reduce a volume of at least one of the speakers according to the determined direction.

15. The headset according to claim 10, wherein the processor is operable to communicate the heat signature as a visual display.

16. The headset according to claim 10, wherein the processor is operable to notify the headset user according the presence of the person in the area surrounding the headset user.

17. The headset according to claim 10, wherein the processor is operable to notify the headset user with one or more of an audio alert and a vibration alert.

18. The headset according to claim 10, wherein the one or more sensors comprises an infrared sensor.

* * * * *